United States Patent
Speier et al.

(10) Patent No.: US 10,928,477 B2
(45) Date of Patent: Feb. 23, 2021

(54) MAGNETIC RESONANCE METHOD AND APPARATUS FOR OBTAINING PATIENT MOVEMENT INFORMATION

(71) Applicant: Siemens Healthcare GmbH, Erlangen (DE)

(72) Inventors: Peter Speier, Erlangen (DE); Markus Vester, Nuremberg (DE); Karsten Wicklow, Bamberg (DE)

(73) Assignee: Siemens Healthcare GmbH, Erlangen (DE)

( * ) Notice: Subject to any disclaimer, the term of this patent is extended or adjusted under 35 U.S.C. 154(b) by 641 days.

(21) Appl. No.: 15/674,568

(22) Filed: Aug. 11, 2017

(65) Prior Publication Data
US 2018/0045801 A1 Feb. 15, 2018

(30) Foreign Application Priority Data
Aug. 12, 2016 (DE) .......................... 102016215044.8

(51) Int. Cl.
*G01R 33/567* (2006.01)
*G01R 33/54* (2006.01)
*G01R 33/565* (2006.01)

(52) U.S. Cl.
CPC ....... *G01R 33/5673* (2013.01); *G01R 33/543* (2013.01); *G01R 33/56509* (2013.01)

(58) Field of Classification Search
CPC .......... G01R 33/5673; G01R 33/56509; G01R 33/543; G01R 33/5676; G01R 33/3692
USPC ................................................. 324/318, 322
See application file for complete search history.

(56) References Cited

U.S. PATENT DOCUMENTS

| | | | |
|---|---|---|---|
| 2013/0257433 A1 | 10/2013 | Martius et al. | |
| 2016/0245888 A1 | 8/2016 | Bollenbeck et al. | |
| 2016/0274204 A1* | 9/2016 | Song | G01N 24/081 |
| 2017/0160364 A1* | 6/2017 | Fenchel | G01R 33/5673 |
| 2017/0160367 A1 | 6/2017 | Schroter et al. | |
| 2018/0353139 A1* | 12/2018 | Speier | A61B 5/7285 |
| 2018/0353140 A1* | 12/2018 | Speier | A61B 5/7289 |

FOREIGN PATENT DOCUMENTS

DE 102012205333 A1 10/2013

OTHER PUBLICATIONS

Hanson et al., "Encoding of Electrophysiology and Other Signals in MR Images", Journal of Magnetic Resonance Imaging, vol. 25, pp. 1059-1066, (2007).

* cited by examiner

*Primary Examiner* — Rishi R Patel
(74) *Attorney, Agent, or Firm* — Schiff Hardin LLP

(57) ABSTRACT

In a method and a magnetic resonance apparatus for generating movement information relating to an examination region of a patient, a reception circuit is provided that receives MR signals within a reception frequency range. An electromagnetic signal is generated that has a first frequency that is outside the reception frequency range of the reception circuit, and that interacts with at least some of the examination region, so the electromagnetic signal undergoes a modification. A modulated signal based on the modified first signal is generated that has a frequency within the reception frequency range. The modulated signal is transmitted to the reception circuit, and is forwarded to a computer, wherein movement information is determined based on the modulated signal.

16 Claims, 5 Drawing Sheets

MAGNETIC RESONANCE METHOD AND APPARATUS FOR OBTAINING PATIENT MOVEMENT INFORMATION

BACKGROUND OF THE INVENTION

Field of the Invention

The invention concerns a method and magnetic resonance (MR) apparatus with which movement information relating to an examination region of a patient is obtained.

Description of the Prior Art

In MR imaging, the basic field magnet of an MR data acquisition scanner is conventionally operated to expose the examination object to be examined, for example a patient, to a relatively high basic magnetic field, for example of 1.5 or 3 tesla. In addition, a magnetic field gradient is applied by a gradient coil arrangement. Radio-frequency excitation signals are then emitted by a radio-frequency antenna by suitable antenna coils, in order to cause the nuclear spins of particular atoms that are excited in a resonant manner by this radio-frequency field to be tilted by a defined flip angle relative to the magnetic field lines of the basic magnetic field. During the resulting precession of the nuclear spins, magnetic resonance signals (MR signals) are emitted, and are received by suitable receiving antennas, and then processed to form image data.

The recording period, which includes the generation and acquisition of the MR signals over time, typically lasts several seconds to several minutes, so when the examination object is a patient, the patient is typically subject to movement during the recording period. External movements, such as movements of the entire head, should typically be avoided during the recording period. Movements attributed to breathing or beating of the heart may be suppressed only to a limited extent, or may not be suppressed. Since movement affects the MR imaging and the image quality, obtaining movement information about the patient is desirable. Based on such movement information the MR imaging can be controlled in a triggered manner, and/or the effect of the items of movement information on the image data can be corrected and/or in the event of the movement exceeding a particular threshold, recording of the MR signals can be interrupted and/or re-started.

SUMMARY OF THE INVENTION

An object of the invention is to provide a simple and accurate method for generating movement information relating to an examination region of a patient with a magnetic resonance apparatus. Furthermore, it is an object of the invention to provide a magnetic resonance apparatus that is designed to implement the method.

The inventive method for generating movement information relating to an examination region of a patient is implemented with a magnetic resonance apparatus that has a reception circuit that receives MR signals within a reception frequency range. The inventive method has the following method steps.

An electromagnetic signal is generated that has a frequency outside of the reception frequency range of the reception circuit, and this electromagnetic signal interacts with at least some of the examination region, thereby causing the electromagnetic signal to undergo a modification.

A modulated signal is generated that is based on the modified electromagnetic signal, so the modulated signal has a frequency within the reception frequency range.

The modulated signal is transmitted to the reception circuit, and then to a processor or computer. Movement information is determined in the processor based on the modulated signal, and an electronic signal is generated that represents the movement information, and is made available as an output.

The movement of a patient can be an external movement. An external movement is a movement of the surface of the patient. An external movement can be, for example, a movement of an arm relative to the remainder of the body of the patient. An external movement can be detected, for example, visually or with the use of a camera. The movement of a patient also can be an internal movement. Internal movements are movements that occur inside the patient, which typically cannot be detected visually without medical imaging methods. For example, this can be blood flow inside the arteries. The examination region is preferably a section of the patient that is typically subject to a movement. The examination region can be visually displayed using MR imaging. The examination region may also be located outside of a section of the patient that is displayed using the MR imaging. The examination region may be located outside of a homogeneous region of the MR scanner, in which optimum MR imaging is achieved. This is possible because a homogeneous basic magnetic field is not required in the examination region for conducting the inventive method.

The reception circuit is typically a coil, which reception circuit is designed to detect MR signals, and optionally to amplify them and transmit them to a control computer, in particular to the processor. The processor is designed to generate image data based on the MR signals. MR signals are typically radio-frequency signals whose frequency is determined by the strength of the basic magnetic field of the magnetic resonance scanner. The frequency of the MR signals typically corresponds to the Larmor frequency of hydrogen protons at the strength of the basic magnetic field of the magnetic resonance scanner and is, for example, 64 MHz or 127 MHz. The reception circuit can typically detect electromagnetic signals, in particular MR signals that have a frequency within a reception frequency range determined by the reception circuit. The reception frequency range typically includes the Larmor frequency of the hydrogen protons and has a bandwidth of, for example, 500 kHz.

The reception circuit can also be designed so as to receive an MR signal even though the frequency of the MR signal is changed, in particular shifted, before further transmission thereof, so the MR signal is transmitted, for example to a control computer, downstream of the reception circuit at an intermediate frequency, in other words, a different frequency from the input frequency of the MR signal and/or a different frequency from the Larmor frequency. The intermediate frequency can be, for example, less than 20 MHz. In this case the reception frequency range of the reception circuit can include the intermediate frequency, instead of the input frequency of the MR signal or instead of the Larmor frequency. The reception frequency range preferably is a frequency range with a bandwidth of, for example, 500 kHz around the intermediate frequency. The modulated signal preferably has a frequency within the reception frequency range. In this case the modulated signal is typically not received by the antenna of the reception circuit, which antenna records the MR signal, but instead the modulated signal is preferably fed into the reception circuit at a section of the reception circuit once the change in the frequency, in particular the shift in the frequency, of the MR signal has occurred.

The electromagnetic signal can be generated, for example, by a transmitting circuit. The electromagnetic signal has at least one first frequency. The amplitude of the electromagnetic signal is preferably constant and/or the electromagnetic signal preferably has only one frequency. The first frequency is outside of the reception frequency range of the reception circuit. If the electromagnetic signal has a number of frequencies, the component of the electromagnetic signal having the first frequency typically cannot be detected by the reception circuit.

Before the electromagnetic signal can reach the reception circuit, it typically penetrates at least some of the examination region. During penetration of the examination region, the electromagnetic signal interacts with the examination region, in other words with the patient, causing it to undergo a change. The phase and/or the amplitude of the electromagnetic signal may be changed, in other words be modified. The interaction can change the frequency of the electromagnetic signal, in particular the first frequency of the electromagnetic signal. The modification can depend on the different properties of the examination region. The properties may be, for example
 a transition between examination region and surrounding air
 dielectric properties of the examination region
 a movement that occurs in and/or on the surface of the examination region.

The modified signal is detected. The modified signal can be modulated such that the resulting modulated signal has a frequency within the reception frequency range. The modulation can occur such that the component of the electromagnetic signal having the first frequency is modulated to a frequency within the reception frequency range, for example the Larmor frequency. Information about the modification induced by the interaction is preferably retained during modulation. This modulation can occur, for example, by a frequency converter. Preferably all frequencies encompassed by the modified signal are considered. The frequencies encompassed by the modified signal can be mutually different frequencies in the modulated signal, with the mutually different frequencies preferably lying within the reception frequency range.

The modulated signal is transmitted to the reception circuit. The modulated signal can be emitted, for example wirelessly, in the form of electromagnetic waves. The reception circuit captures, in other words detects, the modulated signal completely, since the frequencies encompassed by the modulated signal lie within the reception frequency range. The reception circuit transmits the modulated signal to a control computer of the magnetic resonance apparatus analogously to the detected MR signals.

The movement information can be determined by evaluation of the modulated signal. The movement information may indicate, for example, an internal and/or external movement of the patient. The movement information can include the change in location over time of a tissue section encompassed by the examination region. The movement information is determined based on the modulated signal, for example, as in the subsequently published DE 10 2015 203 385 with the recorded excitation signal.

An advantage of the inventive method is that the frequency of the electromagnetic signal can be chosen independently of the reception frequency range. The frequency can be chosen in such a way that movement of the patient can be detected particularly accurately. The first frequency can be matched to the movement to be detected and/or be changed over time. A particularly accurate item of movement information can consequently be determined.

The modulation of the modified signal makes it possible to receive the modulated signal, which comprises contains or presents information for determining the movement information, with a reception circuit that receives the modulated signal and the MR signal. The modulated signal and MR signal can be received simultaneously. An advantage of this method is that only slight changes to the magnetic resonance apparatus are required in order to implement the method, and these can be easily implemented by a user and do not require the presence of a technician. A modulator for modulation of the modified signal can be flexibly arranged and/or used when implementing the inventive method. Further components and/or consumables required for implementing the inventive method, such as local receiving coils, which include a modulator, and/or positioning aids, can be combined subsequently with the magnetic resonance apparatus, after the original installation of the magnetic resonance apparatus, even if the magnetic resonance apparatus was not originally designed to be able to implement the inventive method.

In an embodiment of the method, the first frequency is greater than the maximum frequency encompassed by the reception frequency range. The first frequency is in particular at least three times, preferably at least five times, preferably at least ten times, as high as the maximum frequency encompassed by the reception frequency range. The first frequency is, for example, higher than 1 GHz. The electromagnetic signal preferably has only the first frequency. The higher the first frequency is chosen to be, the more strongly the electromagnetic signal can interact with the examination region and/or the more strongly the electromagnetic signal can be attenuated during passage through the examination region and/or the more strongly the phase of the electromagnetic signal can be modified during passage through the examination region. These correlations typically apply, since at higher frequencies, in other words shorter wavelengths, the change in phase is greater during penetration of the examination region. In addition, the electromagnetic signal is exposed to stronger local changes due to dielectric resonance effects than at a higher first frequency.

As a result of these effects, modifications of the electromagnetic signal can be detected and also localized better than at higher frequencies. For example, the cause of the modification can be accurately localized such that the organ that causes the modification, for example the heart, can be identified. In addition, the modified and/or the modulated signal has a higher signal-to-noise ratio at higher frequencies. The electromagnetic signal has a higher sensitivity with respect to movement the higher the first frequency is. Movement information accordingly can be determined particularly accurately based on an electromagnetic signal having a first frequency that is higher than the Larmor frequency. The movement information is particularly stable over the course of time.

In another embodiment of the method, the electromagnetic signal has the first frequency and a second frequency, with the difference between the first frequency and the second frequency being within the reception frequency range. The spectrum of the electromagnetic signal preferably has a first peak at the first frequency and a second peak at the second frequency. The electromagnetic signal can be generated with a transmitting circuit having a first transmitter that generates the first frequency and a second transmitter that generates the second frequency. The transmitting circuit preferably has a transmitting antenna that radiates the complete electromagnetic signal.

If the reception circuit has, for example, a reception range of 63 MHz to 65 MHz, then, for example, the first frequency can be 2,000 MHz and the second frequency can be 2,064 MHz. The modulation of the modified signal preferably includes forming the difference between the first frequency and the second frequency. This can be done, for example, by a modulator, such as a diode. The modulated signal then has a frequency of 64 MHz. If the magnetic resonance apparatus can generate a basic magnetic field having a strength of 1.5 tesla, the reception frequency range typically includes 64 MHz. The modulated signal therefore can be recorded by the reception circuit.

The electromagnetic signal can have more than two frequencies. For example, the first frequency can be 2,000 MHz, the second frequency can be 2,064 MHz and a third frequency can be 2,064.01 MHz. The modulator can be designed such that the difference is formed from pairs of two frequencies, respectively. The modulated signal preferably has the difference frequencies, which are within the reception frequency range.

An advantage of this embodiment of the inventive method is that an existing reception circuit of the magnetic resonance apparatus can be used for this purpose and at the same time the diversity of the electromagnetic signal can be increased by using at least two different frequencies. As a result, a particularly large number of accurate items of movement information can be determined based on the modulated signal. The modulation of the modified signal is particularly easy to implement and can be done, for example, by passive electronic components with the described choice of first frequency and second frequency. As a result, the components required for implementing the method can be particularly inexpensive. A magnetic resonance apparatus that was not designed to implement the inventive method at its original installation, can be retrofitted inexpensively with the required modulator.

In another embodiment of the method, the electromagnetic signal has the first frequency and another frequency that is within the reception frequency range. The first frequency is preferably higher than the maximum frequency encompassed by the reception frequency range, and higher than the other frequency. The electromagnetic signal is preferably a continuous electromagnetic wave, having the first frequency modulated by the other. An electromagnetic signal of this kind can be generated, for example, with a transmitting circuit having a transmitter. The first frequency can be, for example, 2,000 MHz, the other frequency can be, for example, 64 MHz. During modulation of the modified signal, the radio-frequency components of the signal can be downmixed with the first frequency to a frequency in the reception frequency range. The other frequency can be, for example, the Larmor frequency. The electromagnetic signal can be modulated with at least one further frequency.

An advantage of this embodiment of the inventive method is that an existing reception circuit of the magnetic resonance apparatus can be used for this purpose and at the same time the diversity of the electromagnetic signal can be increased by the use of at least two different frequencies. The modulation of the modified signal is particularly easy to implement with the described choice of first frequency and the other frequency.

In another embodiment of the method, the electromagnetic signal is a first electromagnetic signal and, in addition to the first electromagnetic signal having the first frequency, a second electromagnetic signal having a second frequency is generated, with the difference between the first frequency and the second frequency being within the reception frequency range. The second electromagnetic signal interacts with at least some of the examination region, so the second electromagnetic signal undergoes a modification and the modulated signal is generated on the basis of the modified first signal and the modified second signal.

The first electromagnetic signal is preferably a continuous electromagnetic wave having the first frequency. The second electromagnetic signal is preferably a continuous electromagnetic wave having the second frequency. The first electromagnetic signal is preferably generated by a first transmitting circuit and the second electromagnetic signal is preferably generated by a second transmitting circuit. A further transmitting circuit can generate a further electromagnetic signal having a further frequency. For example, the first frequency can be 2,000 MHz, the second frequency 2,064 MHz and the further frequency 2,064.01 MHz. The modulator can be designed such that the difference is formed from two frequencies, respectively. The difference frequencies can be spectrally separate from each other for determining the movement information. The second electromagnetic signal can have the first frequency and a third frequency, the third frequency beings within the reception frequency range. The first electromagnetic signal can have the first frequency and additional frequency, with the additional frequency being within the reception frequency range. The multiple transmitting circuits are preferably situated at different locations from each other.

An advantage of this embodiment of the inventive method is that the movement information can be determined more accurately by using at least two electromagnetic signals since the diversity of the electromagnetic signals is increased.

In another embodiment of the method, the electromagnetic signal is a first electromagnetic signal, and the first electromagnetic signal having the first frequency is generated at a first position, and a second electromagnetic signal having a second frequency is generated at a second position in a first period. According to this embodiment a third electromagnetic signal having the first frequency is generated at a third position and a fourth electromagnetic signal having the second frequency is generated at a fourth position in a second period. Preferably the first position matches the third position or the second position matches the fourth position.

The first period preferably is a defined period, for example a few milliseconds. The first period and the second period preferably do not overlap in time. The first position, the second position, the third position and the fourth position typically indicate locations at which an electromagnetic signal can be generated. One transmitting circuit is typically respectively arranged at each of these positions. An electromagnetic signal is preferably generated at at least three different locations. Preferably the first electromagnetic signal is generated at the first position and the second electromagnetic signal is simultaneously generated at the second position in the first period. The first position preferably matches the third position. The third electromagnetic signal can therefore be generated in the second period at the third position, which preferably matches the first position, and the fourth electromagnetic signal can simultaneously be generated at the fourth position. Two electromagnetic signals respectively can therefore be generated in the first period and in the second period, with a first of the two electromagnetic signals having the first frequency and a second of the two electromagnetic signals having the second frequency. The electromagnetic signals differ from each other in the first and second periods such that at least one location of generation of an electromagnetic signal in the second period is different compared to the first period.

An advantage of this embodiment of the inventive method is that the diversity of the electromagnetic signal can be increased by using different positions for emitting the electromagnetic signals. Use of just two different frequencies can be sufficient. A change in the modification of the electromagnetic signal, whose position was changed for emitting, can be achieved by changing at least one position for emitting the electromagnetic signal. Therefore, when using just two different frequencies in the second period compared to the first period, the interference of the two electromagnetic signals can also be changed at the receiving position, wherein the receiving position is typically characterized in that the modified signal is received at this location, for example by the modulator or by an input antenna encompassed by the modulator. The movement information can be generated and/or determined more accurately as a result.

In another embodiment of the method, the generation of the modulated signal is implemented by a non-linear electrical component.

Furthermore, the invention includes a magnetic resonance apparatus having a data acquisition scanner having a transmitting circuit, a control computer, a modulator, a reception circuit, and a determining processor. The magnetic resonance apparatus is designed to implement the inventive method for generating movement information relating to an examination region of the patient.

The transmitting circuit is designed to generate an electromagnetic signal having a frequency. For this purpose, an alternating voltage having that frequency is fed into the transmitting circuit, which consequently emits the electromagnetic signal. The transmitting circuit is preferably positioned such that the electromagnetic signal is emitted in the direction of the examination region of the patient so as to interact with at least some of the examination region, so as to produce a modified signal.

The modulator is designed to process the modified signal and, if present, the modified second signal, in such a way that a modulated signal is generated, which modulated signal has a frequency within the reception frequency range. For this purpose, the modulator preferably has a non-linear component, such as a diode, for frequency conversion. In addition, the modulator can have at least one antenna for receiving the modified signal. The modulator is preferably designed to transmit the modulated signal to the reception circuit. For this purpose, the modulator can have a transmitting antenna that wirelessly transmits the modulated signal. The modulator can be connected by a cable connection to the reception circuit. The modulator can form a separate unit.

The reception circuit is designed to receive signals in the reception frequency range. The reception circuit therefore preferably receives the modulated signal and an MR signal. The reception circuit transmits a received signal to the control computer of the magnetic resonance apparatus. The reception circuit preferably implements further processing required for this purpose, such as an amplification of the signal. The reception circuit can likewise have a frequency change module that changes the frequency of the received signal before it is forwarded and/or transmitted to the control computer and/or to the determining processor.

The control computer is designed to control and/or coordinate the units of the magnetic resonance apparatus required for implementing the inventive method. For example, the control computer can initiate control of the transmitting circuit, in particular feeding an alternating voltage having the frequency thereto. Furthermore, the control computer can control the components of the magnetic resonance apparatus required for generating MR signals. The control computer typically has an input via which MR signals and/or the modulated signal and optionally an algorithm for implementing the inventive method can be provided to the control computer. Further functions, algorithms or parameters required in the method can be provided for the control computer via the input. The control computer preferably has a base processor. The inventive method is preferably executed by an algorithm that runs in the base processor.

The control computer can include the determining processor, or the determining processor can be installed separately from the control computer. The determining processor is designed to generate the movement information based on the modulated signal. For this purpose, the determining processor has an input via which the modulated signal, and optionally an algorithm for determining the movement information based on the modulated signal, can be provided to the determining processor. The determining processor has a base processor and/or can command part of a base processor that is in another component. Further functions, algorithms or parameters required in the method can be provided to the determining processor via the input. The determining processor has an output via which the determined movement information and/or further results of an embodiment of the inventive method can be provided as an output signal.

The control computer and/or the determining processor can be integrated in the magnetic resonance apparatus. The control computer and/or the determining processor can also be installed separately from the magnetic resonance apparatus. The control computer and/or the determining processor can be connected to the magnetic resonance apparatus.

In an embodiment, the modulator has a non-linear component. A non-linear component is typically an electrical component that has a non-linear correlation between particular electrical variables. For example, a diode is a non-linear component. The non-linear component can be designed such that it is arranged in direct contact with the patient and/or the patient's clothing. The non-linear component can be a consumable that is disposed of after use in an examination.

In another embodiment, the modulator has a passive component. A passive component is typically an electrical component that does not exhibit an amplification effect and does not have a control function. The modulator then implements a passive frequency conversion, so the target frequency of the modulated signal lies within the reception frequency range. For example, the passive component can be an RFID element. The passive component, such as the RFID element, is preferably designed so that it is also a non-linear component.

An RFID element can be glued to the skin of the patient, for example, or can be attached to the patient's clothing. The non-linear and/or the passive component, in particular an RFID element, can be designed in the form of a sticker. The passive and/or the non-linear component, in particular an RFID element, can be designed as a transponder having an integrated transmitting and/or receiving antenna. Other non-linear and/or passive components that are considered expedient to those skilled in the art can be used as an alternative embodiment of the invention without departing from the scope of the invention.

An advantage of the non-linear and/or passive components is that such components can be inexpensively manufactured. In the embodiment as a sticker, the modulator can be attached to the patient before the start of the examination and the modulator and the non-linear and/or passive component thereof can be positioned particularly accurately. The non-linear and/or passive component can be separate from the magnetic resonance apparatus, so it is not encompassed by the magnetic resonance apparatus.

A non-linear component of this kind can be placed in direct contact with the patient. The modified electromagnetic signal can accordingly be detected directly after penetration into the patient and/or be considered during generation of the modulated signal. Modification of the electromagnetic signal is primarily the result of the interaction of the electromagnetic signal with the patient. The modified electromagnetic signal accordingly contains particularly detailed items of movement information, which can be extracted with the modulator and/or determining processor.

In another embodiment, the magnetic resonance apparatus has a second transmitting circuit, and the first transmitting circuit and the second transmitting circuit are arranged at different positions. The first transmitting circuit generates the aforementioned electromagnetic signal as a first electromagnetic signal having a first frequency, and the second transmitting circuit generates a second electromagnetic signal having a second frequency. The first transmitting circuit and/or the second transmitting circuit are designed such that when an alternating voltage and/or an alternating current having the first frequency and/or the second frequency is applied thereto, the first electromagnetic signal and/or the second electromagnetic signal is emitted. An alternating voltage and/or an alternating current can be applied by the control computer.

As noted, the first transmitting circuit and the second transmitting circuit are at different locations so as to be spatially separate from each other. For example, the first transmitting circuit can be arranged within a housing that surrounds the magnetic resonance scanner and the second transmitting circuit can be arranged next to and/or above the first transmitting circuit inside the housing that surrounds the magnetic resonance scanner, or be arranged on a patient-positioning device.

Between the modulator and the first transmitting antenna of the first transmitting circuit, the first electromagnetic signal penetrates at least some of the examination region and undergoes a first modification during a movement of the examination region or a movement within the examination region. Between the modulator and the second transmitting antenna of the second transmitting circuit, the second electromagnetic signal penetrates at least some of the examination region and undergoes a second modification during the movement of the examination region or a movement within the examination region. The first modification typically differs from the second modification in at least one different modification of the amplitude and/or modification of the phase of the first and second electromagnetic signals. The modulator preferably receives a modified first signal having a first frequency and a first modification, and a modified second signal having a second frequency and a second modification. The modulator is preferably designed to receive, modulate, and inventively transmit to the reception circuit the modified first signal and the modified second signal. The modulated signal contains items of information about the first modification and/or the second modification and/or the first frequency and/or the second frequency. The determining processor analyzes and/or separates the first modification and/or the second modification and/or the first frequency and/or the second frequency. The magnetic resonance apparatus can have a third transmitting circuit designed to generate a third electromagnetic signal having a third frequency.

An advantage of this embodiment of the magnetic resonance apparatus is that the movement information can be determined particularly accurately by using two transmitting circuits at different spatial positions. In addition to the first modification, the second modification, which typically differs from the first modification and/or is independent thereof, can be used for determining the movement information.

In another embodiment, the patient is at least partially arranged between the first transmitting circuit and the second transmitting circuit. The distance that is the shortest connection between the first transmitting circuit and the second transmitting circuit includes at least one point in space that is inside the patient. The first electromagnetic signal is accordingly transmitted from a first direction into the patient and the second electromagnetic signal is accordingly transmitted from a second, different direction into the patient. The first direction preferably differs from the second direction by an angle of at least 90°, more preferably by an angle of at least 140°, and most preferably by an angle of 180°. A second modulator is arranged on the first transmitting antenna and/or a first modulator is arranged on the second transmitting antenna. The first modulator is designed to receive and modulate the modified first signal. The second modulator is designed to receive and modulate the modified second signal. The modulated first signal and the modulated second signal are transmitted to the reception circuit. The magnetic resonance apparatus can have a number of reception circuits, with the modulated first signal and the modulated second signal being respectively transmitted to different reception circuits. The modulated first signal and the modulated second signal can be transmitted to at least one reception circuit of the multiple of reception circuits. In this embodiment, the first modified signal and the second modified signal respectively have different phases which cause a particularly pronounced change in the phase of the modulated signal. An advantage of this embodiment of the method is that the movement information can be determined particularly accurately by using two transmitting circuits positioned in this way.

In an embodiment, the magnetic resonance apparatus has a number of reception circuits at respectively different positions, and at least two modulators, and at least two of the reception circuits are respectively connected to different modulators, in particular for the purpose of data exchange. A first reception circuit of the multiple of reception circuits is connected to a first modulator of the at least two modulators, and a second reception circuit of the multiple reception circuits is connected to a second modulator of the at least two modulators. The connection can be designed wirelessly, for example. The connection can be designed for example with cables and/or optical waveguides.

The at least two modulators are respectively at different positions. The distance between the first modulator and first reception circuit is shorter than the distance between the first modulator and the second reception circuit. The distance between the second modulator and the second reception circuit is shorter than the distance between the second modulator and the first reception circuit.

The use of at least two modulators enables simultaneous reception of a modified signal at different positions. In particular, when using a first electromagnetic signal and a second electromagnetic signal, the modified first signal and the modified second signal are received simultaneously at two different positions. The number of items of information provided for determining the movement information, encompassed by the modulated signal, can be increased and consequently the movement information can be determined particularly accurately due to the resulting spatial diversity of the modulated signal.

In another embodiment, the modulator is integrated in the reception circuit. The components of the magnetic resonance apparatus for generating the movement information can accordingly be designed so as to be particularly compact. As a result, the modulator is made robust and/or not very prone to errors. When the modulator is integrated in the reception circuit, the modulator does not have to be arranged on the patient, in particular adhered to the patient's clothing or skin, before an examination of the patient during which the inventive method is used. The examination of the patient is consequently less time-intensive for the operator of the magnetic resonance apparatus. If the reception circuit is arranged before the start of the examination of the patient such that it at least partially surrounds the examination region, the modulator is thereby positioned at the same time in the process. As a result, the position of the modulator thus can be accurately determined. Furthermore, the modulator can be positioned more easily. The reception circuit can be permanently mounted at a position of the magnetic resonance apparatus and/or can be permanently integrated therein. The modulator can be encompassed in a reception circuit of this kind.

If the reception circuit has a pre-amplifier, the modulator can be designed such that the modulated signals are transmitted to the reception circuit downstream of the pre-amplifier, so they are not amplified by the pre-amplifier. A modulator of this kind does not have a transmitting antenna. A modulator of this kind is preferably connected to the reception circuit by a cable.

The invention also encompasses a modulator having an input antenna, a non-linear component and a transmitting antenna. The modulator can be manufactured and purchased separately, so a magnetic resonance apparatus can be inexpensively retrofitted so that the inventive method can be implemented even though the magnetic resonance apparatus was not originally designed for implementing the inventive method.

Furthermore, the invention encompasses a transmitting circuit designed to generate the electromagnetic signal. The transmitting circuit can be manufactured and purchased separately, so a magnetic resonance apparatus can be inexpensively retrofitted so that the inventive method can be implemented thereby, even though the magnetic resonance apparatus was not originally designed to implement the inventive method.

Embodiments of the inventive magnetic resonance apparatus are constructed analogously to the embodiments of the inventive method. The magnetic resonance apparatus can have further control components that are required and/or advantageous for implementing the inventive method. The magnetic resonance apparatus can also be designed to transmit control signals and/or to receive and/or process control signals in order to implement the inventive method. The determining processor is preferably part of the control computer of the inventive magnetic resonance apparatus. Computer programs and further software can be stored in a memory of the control computer, by which the base processor automatically controls and/or implements the inventive method.

The advantages of the inventive magnetic resonance apparatus essentially correspond to the advantages of the inventive method for generating movement information relating to an examination region of a patient, and as described above in detail. Features, advantages or alternative embodiments mentioned above are also applicable to all aspects of the invention.

DESCRIPTION OF THE PREFERRED EMBODIMENTS

Figure 1:
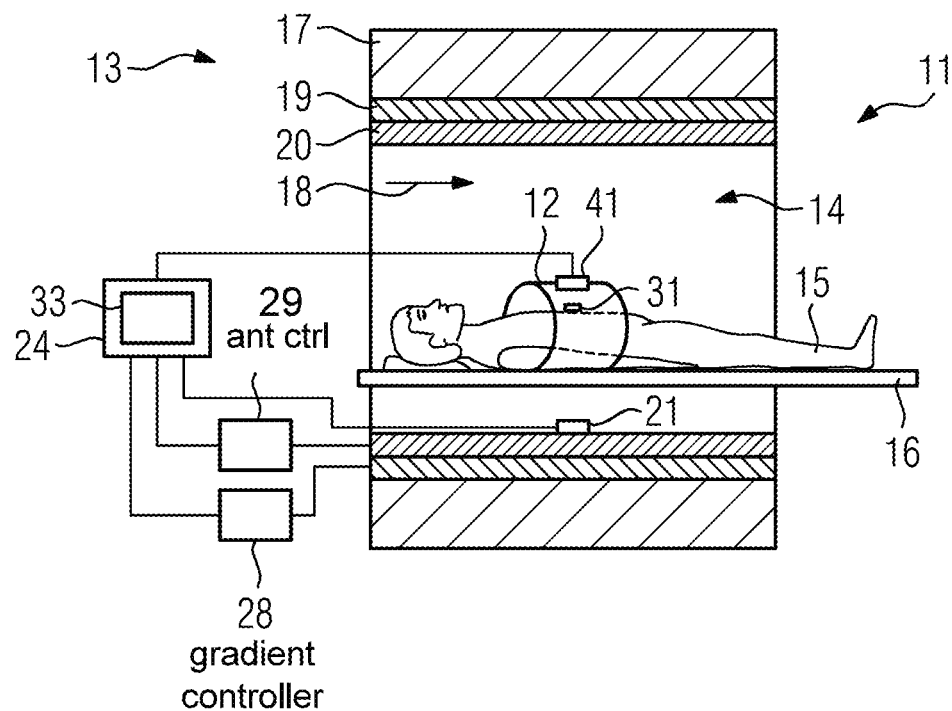
FIG. 1 schematically illustrates an inventive magnetic resonance apparatus.

FIG. 1 shows an inventive magnetic resonance apparatus 11 for implementing an inventive method in a schematic illustration. The magnetic resonance apparatus 11 has an MR data acquisition scanner 13 having a basic magnet 17 that generates a strong and constant basic magnetic field 18. The scanner 13 has a cylindrical patient-receiving region 14 for receiving a patient 15, with the patient-receiving region 14 being cylindrically surrounded in a circumferential direction by the scanner 13. The patient 15 can be moved by a patient-positioning support 16 into the patient-receiving region 14. The patient-positioning support 16 has for this purpose an examination table arranged so as to move inside the scanner 13.

The scanner 13 also has a gradient coil arrangement 19 for spatially encoding MR signals during imaging. The gradient coil arrangement 19 is controlled by a gradient controller 28. The scanner 13 also has a radio-frequency antenna 20, which in the illustrated case is designed as a body coil permanently integrated in the scanner 13, and a radio-frequency antenna controller 29. The radio-frequency antenna 20 is controlled by the radio-frequency antenna controller 29 so as to radiate radio-frequency pulses into an examination space that is essentially formed by the patient-receiving region 14. The radio-frequency pulses excite certain nuclear spins in the patient 15, so as to give those nuclear spins a magnetization that causes the excited nuclear spins to be deflected from the field lines of the basic magnetic field 18. As those excited nuclear spins return to the steady state, they emit the aforementioned MR signals, which are detected by the same antenna, or by a different antenna, from which the excitation pulses were radiated.

The patient 15 is partially surrounded by a mount 12, on which mount or fixture 12 a reception circuit 41 is arranged. The reception circuit 41 can be a local radio-frequency coil designed to receive MR signals. MR signals generated by the aforementioned excited nuclear spins thus can be recorded with the reception circuit 41. Furthermore, a first transmitting circuit 21 is arranged inside the patient-receiving region 14, which generates an electromagnetic signal. The electromagnetic signal penetrates the patient 15 and undergoes a modification in the patient 15. A modulator 31 is arranged on the patient 15 so as to generate a modulated signal based on the modified signal, and to transfer it to the reception circuit 41.

For controlling the basic field magnet 17, the gradient controller 28, the radio-frequency antenna controller 29 and the transmitting circuit 21, the magnetic resonance apparatus 11 has a control computer 24. The control computer 24 centrally controls the magnetic resonance apparatus 11, such as to execute MR control sequences. Control information, such as imaging parameters, and reconstructed image data, can be displayed for a user on a display unit 25, for example on at least one monitor, of the magnetic resonance apparatus 11. Furthermore, the magnetic resonance apparatus 11 has an input unit 26, via which a user can enter information and/or imaging parameters during a scanning procedure. The control computer 24 can include the gradient controller 28 and/or the radio-frequency antenna controller 29 and/or the display unit 25 and/or the input unit 26. The control computer 24 is connected to the reception circuit 41 such that MR signals and the modulated signal can be transmitted from the reception circuit 41 to the control computer 24. The control computer 24 also has a determining processor 33. The magnetic resonance apparatus 11 is therefore designed, together with the determining processor 33, to implement the inventive method.

The illustrated magnetic resonance apparatus 11 can have further components that magnetic resonance apparatuses conventionally have. The general manner of operation of a magnetic resonance apparatus is known to those skilled in the art, so a more detailed description is not necessary herein.

Figure 2:
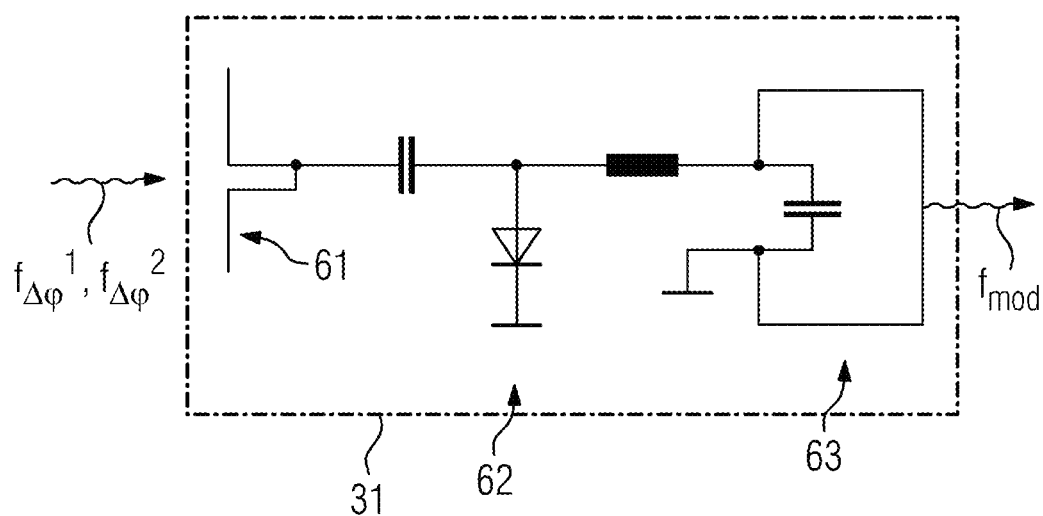
FIG. 2 shows a circuit diagram of a modulator in accordance with the invention.

FIG. 2 shows the inventive modulator 31 in a circuit diagram. The modulator 31 has an input antenna 61, a non-linear component 62 and a transmitting antenna 63. The modified signal having a frequency $f_{A\Phi}^1$ and having a frequency $f_{A\Phi}^2$ is detected by the modulator 31. The input antenna 61 receives the modified signal and is excited with the frequencies $f_{A\Phi}^1$ and $f_{A\Phi}^2$. In the present exemplary embodiment the non-linear component 62 is formed by a capacitive component, a diode and an inductive component, and acts as a high-pass filter followed by a low-pass filter. As a result, a difference frequency of $f_{A\Phi}^1$ and $f_{A\Phi}^2$ is generated, which is the modulated frequency $f_{mod}$. A signal having the frequency $f_{mod}$ is emitted by the transmitting antenna 63. The non-linear component 62 can have passive components only.

Figure 3:
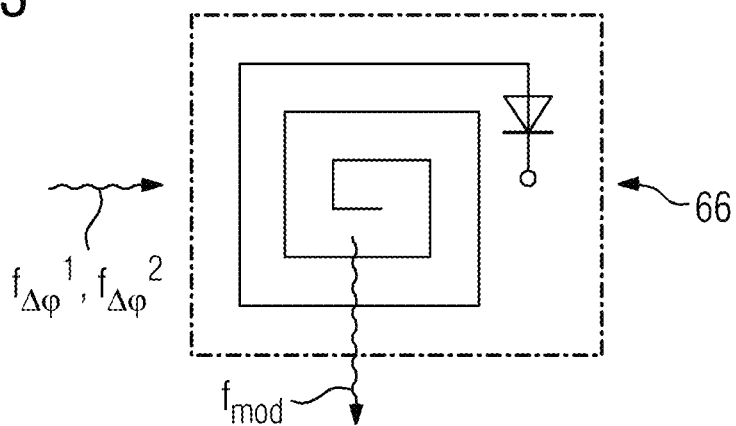
FIG. 3 illustrates a mode of operation of an RFID element in an embodiment of the invention.

FIG. 3 shows an example for a non-linear and passives component, an RFID element 66, which can be encompassed by the modulator 31, and the mode of operation thereof. The RFID element 66 is designed as a non-linear component. The RFID element 66 is designed to modulate the modified first signal having a frequency $f_{A\Phi}^1$ and having a frequency $f_{A\Phi}^2$ and to emit a resulting modulated signal having the frequency $f_{mod}$.

Figure 4:
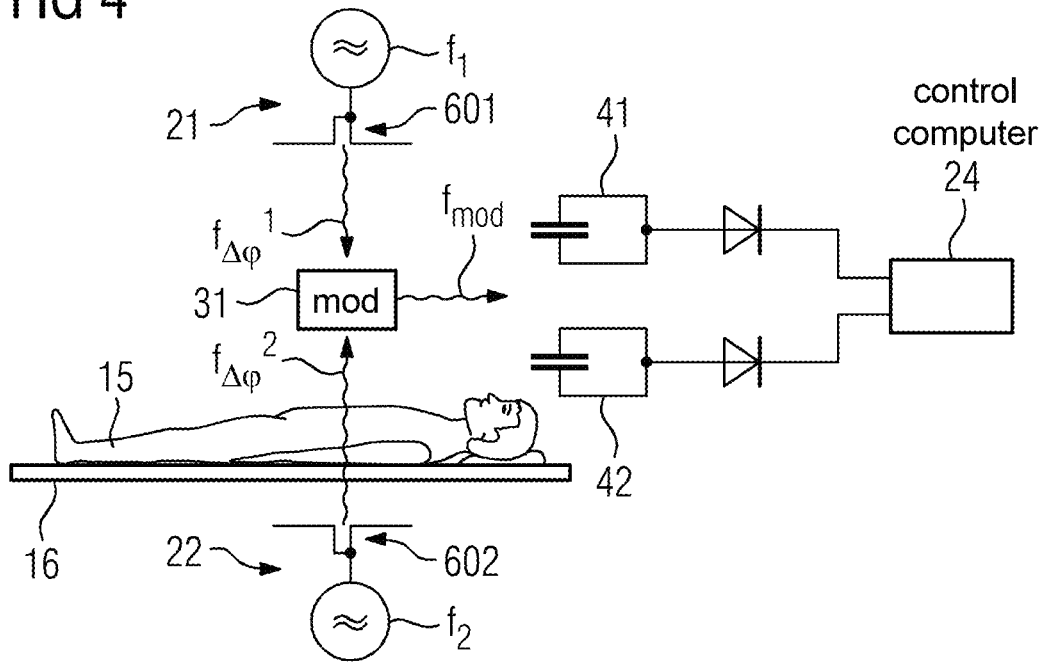
FIG. 4 illustrates a first embodiment of an arrangement for generating movement information in accordance with the invention.

FIG. 4 shows a first embodiment of an arrangement for generating movement information relating to an examination region of a patient. The arrangement can be encompassed by the magnetic resonance apparatus 11. The arrangement has a first transmitting circuit 21 and a second transmitting circuit 22, with the patient 15 being arranged between the two transmitting circuits 21, 22. The transmitting circuits 21, 22 are therefore situated at different positions. The first transmitting circuit 21 has a first excitation antenna 601, which is excited with a frequency $f_1$, so a first electromagnetic signal is generated. The second transmitting circuit 22 has a second excitation antenna 602, which is excited with a frequency $f_2$, so a second electromagnetic signal is generated. The first and/or the second electromagnetic signal penetrate(s) the patient 15, wherein they interact therewith and experience a modification, in particular a change in phase. The first and/or the second electromagnetic signal can also interact with further matter, such as air, and/or other objects, and consequently experience a modification, in particular a phase change. At the position of the modulator 31, the modified first signal has a frequency $f_{A\Phi}^1$ and the modified second signal has a frequency $f_{A\Phi}^2$. The modulator 31 is designed to generate a modulated signal having a frequency $f_{mod}$ from the modified first signal and the modified second signal. This modulated signal is emitted by the modulator 31 and therefore is transmitted to a reception circuit 41. The magnetic resonance apparatus 11 has a number of reception circuits 41, 42 that have the same reception frequency range, and that are designed to detect the modulated signal having a frequency $f_{mod}$ within the reception frequency range and to transmit it to the control computer 24. The multiples reception circuits are also each designed to detect MR signals. In the present exemplary embodiment, the magnetic resonance apparatus 11 has two reception circuits. Basically, the magnetic resonance apparatus 11 can have just a single reception circuit or more than two reception circuits.

Figure 5:
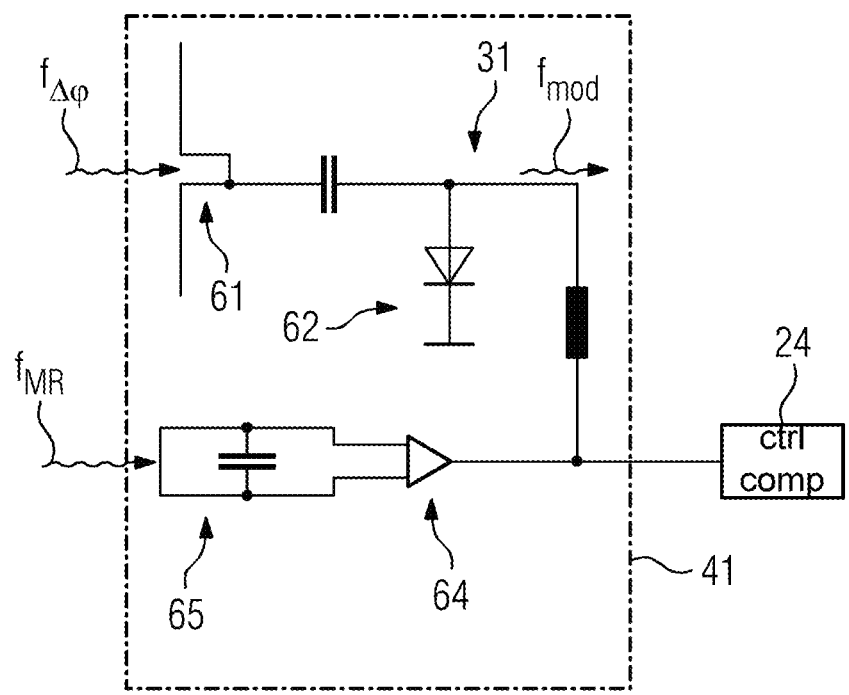
FIG. 5 is a circuit diagram of a reception circuit with a modulator in accordance with the invention.

FIG. 5 shows a reception circuit 41 that includes the modulator 31. An exemplary circuit is shown. The modulator 31 is integrated in the reception circuit 41. Analogously to the modulator 31 shown in FIG. 2, the modulator 31 has an input antenna 61 for receiving the modified signal and a non-linear component 62 for frequency modulation, so a modulated signal having the frequency $f_{mod}$ is generated. In this embodiment, the modulated signal is not emitted by a transmitting antenna 63, but is connected by a cable with a receiving circuit, so as to provide an MR signal having a frequency $f_{MR}$ received to the reception circuit. The frequency $f_{MR}$ is in the reception frequency range of the reception circuit 41 and the MR signal is received by an MR antenna 65 thereof. The MR signal can be amplified, for example with a pre-amplifier 64, before it is combined with the modulated signal and transmitted to the control computer 24. The modulated signal is combined with the MR signal by the reception circuit 41.

Figure 6:
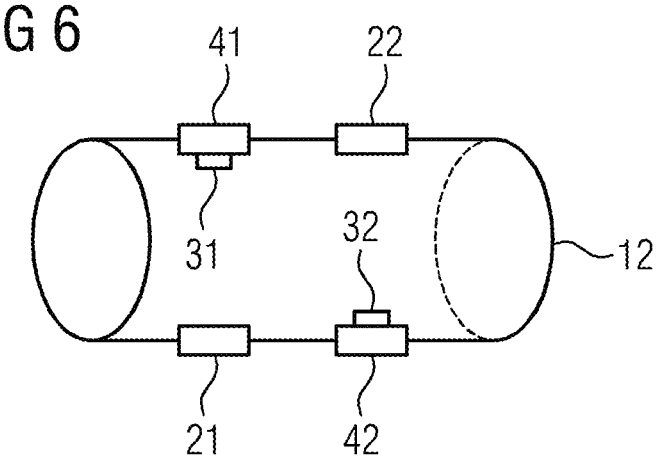
FIG. 6 illustrates a second embodiment of an arrangement for generating movement information in accordance with the invention.

FIG. 6 shows a second embodiment of an arrangement for generating movement information relating to an examination region of a patient 15. According to this arrangement, the magnetic resonance apparatus 11 has two reception circuits 41, 42 respectively at different positions, and two modulators 31, 32. Each of the two reception circuits 41, 42 is connected to one modulator 31, 32 respectively. In addition, the arrangement has two transmitting circuits 21, 22, which are designed to generate first and second electromagnetic signals. All of these circuits can be arranged on and/or in the mount 12. The mount 12 can be arranged around the patient 15 during or after their positioning on the patient-positioning support 16.

Figure 7:
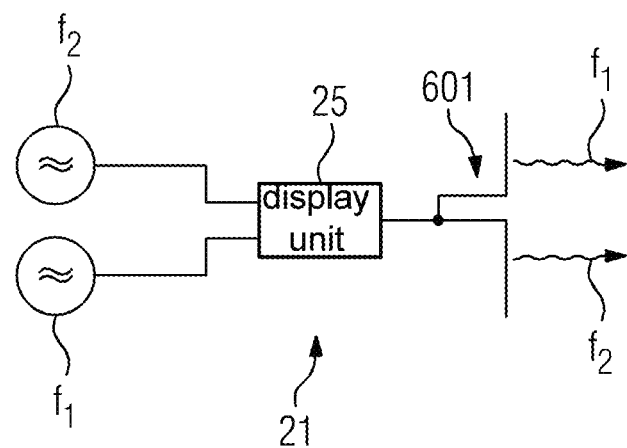
FIG. 7 is a circuit diagram of a first embodiment of a transmitting circuit in accordance with the invention.

FIG. 7 shows a first embodiment of a transmitting circuit 21. The transmitting circuit 21 is designed to generate an electromagnetic signal having a first frequency $f_1$ and having a second frequency $f_2$. For this purpose, a first alternating voltage is generated with $f_1$ and a second alternating voltage is generated with $f_2$ and the two alternating voltages are passed to a mixer 25 that combines the two alternating voltages in order to form an electromagnetic signal. The electromagnetic signal has the frequencies $f_1$ and $f_2$. The electromagnetic signal is emitted by the excitation antenna 601 of the transmitting circuit 21. The difference in the two frequencies $f_1$ and $f_2$ is within the reception frequency range of the reception circuit 41.

Figure 8:
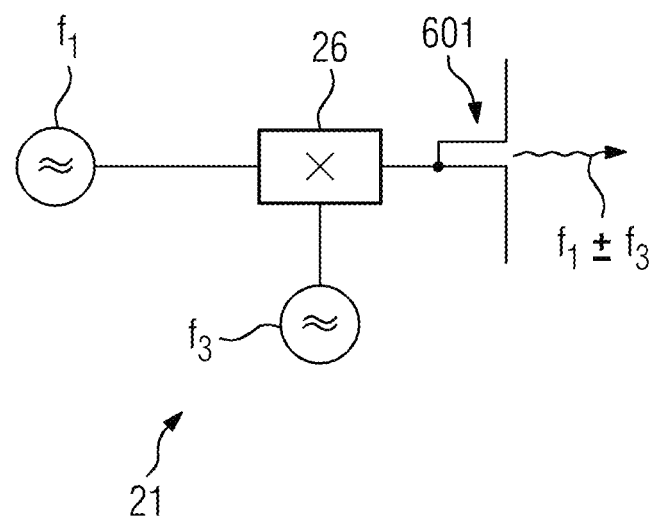
FIG. 8 is a circuit diagram of a second embodiment of a transmitting circuit in accordance with the invention.

FIG. 8 shows a second embodiment of a transmitting circuit 21. The transmitting circuit 21 is designed to generate an electromagnetic signal having a first frequency $f_1$ and a third frequency $f_3$. For this purpose, a first alternating voltage with $f_1$ and a third alternating voltage with $f_3$ are generated, and the two alternating voltages are passed to the mixer 26 which combines the two alternating voltages to form an electromagnetic signal. The third frequency $f_3$ is within the reception frequency range of the reception circuit 41. The first frequency $f_1$ is preferably higher than the third frequency $f_3$, preferably at least three times as high as the third frequency $f_3$. The combined signal is accordingly an electromagnetic signal having a frequency $f_1 \pm f_3$, and this is a first frequency $f_1$ modulated by $f_3$. The electromagnetic signal is emitted by the excitation antenna 601 of the transmitting circuit 21.

Figure 9:
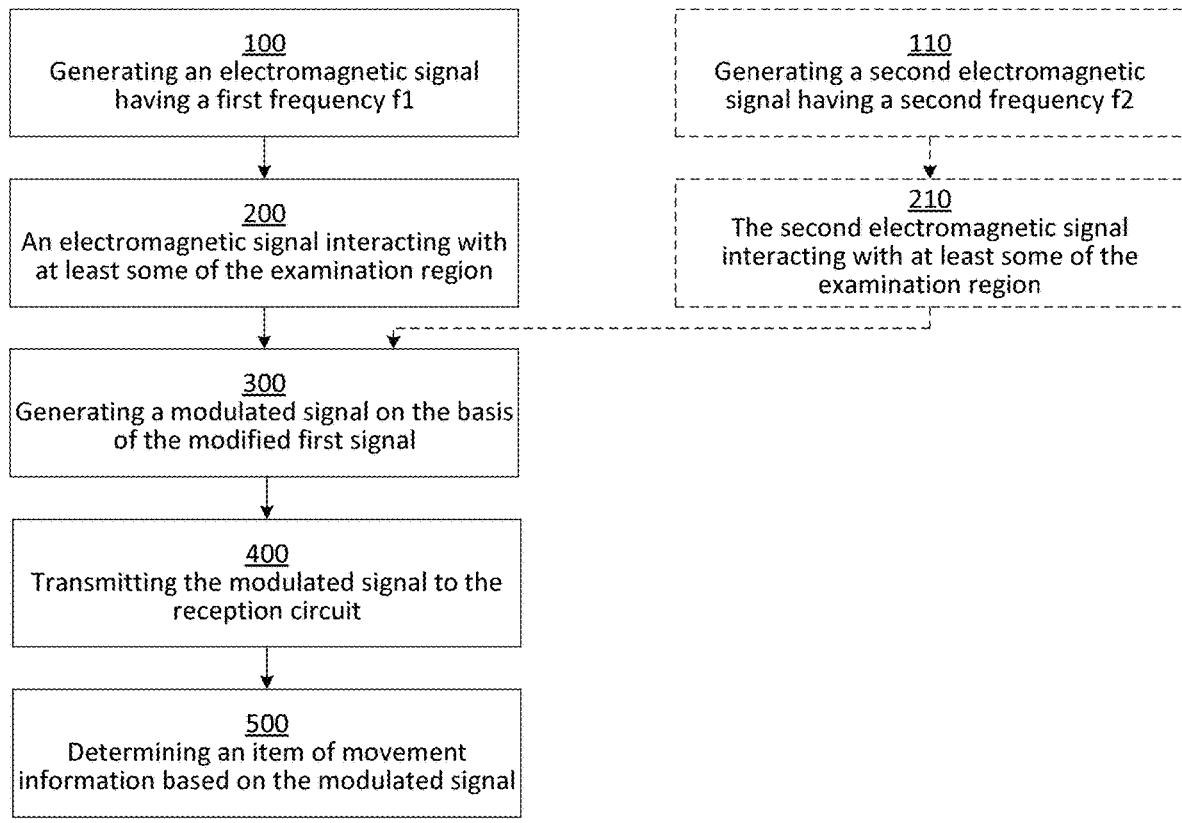
FIG. 9 is a flowchart of an embodiment of the inventive method.

FIG. 9 is a flowchart of an embodiment of the inventive method. In method step 100 an electromagnetic signal having a first frequency $f_1$ is generated, which first frequency $f_1$ is outside of the reception frequency range. The frequency $f_1$ is higher than the maximum frequency encompassed by the reception frequency range. The electromagnetic signal can have a second frequency $f_2$ in addition to the first frequency wherein the difference in the first frequency $f_1$ and the second frequency $f_2$ is within the reception frequency range. The first electromagnetic signal can have a third frequency $f_3$ in addition to the first frequency $f_1$, wherein the third frequency $f_3$ is within the reception frequency range. In method step 200 the electromagnetic signal interacts with at least some of the examination region, wherein the electromagnetic signal undergoes a modification. In method step 300 a modulated signal is generated on the basis of the modified first signal, so the modulated signal has a frequency $f_{mod}$ within the reception frequency range. In method step 400 the modulated signal is transmitted to the reception circuit 41. The modulated signal is received by the reception circuit 41 and is forwarded to the determining processor 33. In method step 500 an item of movement information is determined based on the modulated signal.

Figure 10:
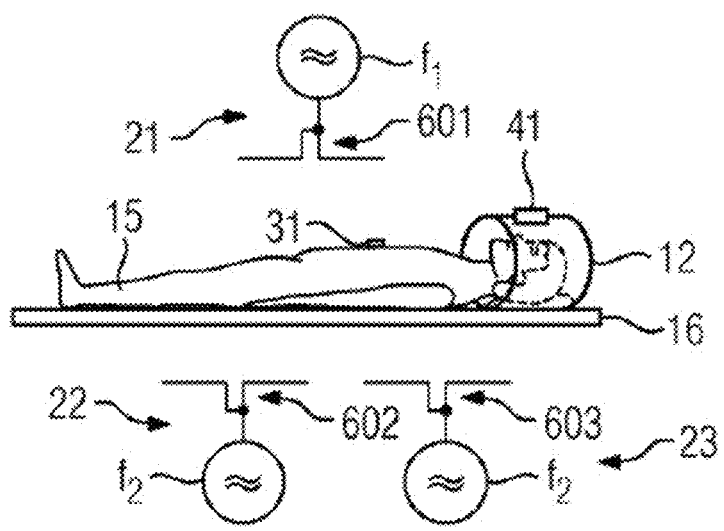
FIG. 10 shows a third embodiment of an arrangement for generating movement information in accordance with the invention.

FIG. 10 shows a third embodiment of an arrangement for generating movement information relating to an examination region of a patient 15. According to this arrangement, the magnetic resonance apparatus 11 has three transmitting circuits 21, 22, 23 respectively at different positions. The first transmitting circuit 21 has a first excitation antenna 601, the second transmitting circuit 22 has a second excitation antenna 602 and the third transmitting circuit 23 has a third excitation antenna 603. The first transmitting circuit 21 is designed to generate a first electromagnetic signal and a third electromagnetic signal, wherein the first electromagnetic signal and the third electromagnetic signal have the first frequency $f_1$. The first electromagnetic signal is generated in the first period and the third electromagnetic signal is generated in the second period of a periodically moving organ. At the same time as the first electromagnetic signal, the second electromagnetic signal having a second frequency $f_2$ is generated in the first period by the second transmitting circuit 22. At the same time as the third electromagnetic signal, a fourth electromagnetic signal having the second frequency $f_2$ is generated in the second period by the third transmitting circuit 23. The modulator 31 is designed to receive the modified electromagnetic signals, to allocate them to the appropriate periods, to modulate them and transmit them to the reception circuit 41. In this exemplary embodiment, the reception circuit 41 is arranged on the head of the patient 15, which is to be depicted in this example by the MR imaging. The examination region corresponds in this case to the trunk or a section thereof. The reception circuit 41 can be arranged on in the mount 12.

In an alternative embodiment a second electromagnetic signal having a second frequency $f_2$ can be generated in method step 110 in addition to the first electromagnetic signal having the first frequency $f_1$, wherein the difference in the first frequency $f_1$ and the second frequency $f_2$ is within the reception frequency range. In method step 210 the second electromagnetic signal interacts with at least some of the examination region, wherein the second electromagnetic signal undergoes a modification. In the alternative embodiment, method step 300 considers the optionally present modified second signal in addition to the modified first signal during generation of the modulated signal.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating movement information relating to an examination region of a patient, comprising:
    operating a magnetic resonance (MR) data acquisition scanner, while a patient, comprising an examination region, is situated in the scanner in order to cause MR signals to be emitted by the examination region, and receiving said MR signals within a reception frequency range of a reception circuit;
    emitting an electromagnetic signal into the patient, said electromagnetic signal having a frequency that is outside of said reception frequency range, so as to cause said electromagnetic signal to interact with at least a part of the examination region of the patient, and thereby causing said electromagnetic signal to undergo a modification so as to produce a modified signal;
    receiving the modified signal by a modulator and, in said modulator, generating a modulated signal from said modified signal, said modulated signal having a frequency that is within said reception frequency range;
    providing the modulated signal to the reception circuit; and
    forwarding the modulated signal from the reception circuit to a processor and, in said processor, determining movement information about said examination region based on said modulated signal, and generating an electronic output signal in said processor that represents said movement information, and making said electronic output signal available from said processor.

2. A method as claimed in claim 1 comprising radiating said electromagnetic signal with said frequency being higher than a maximum frequency encompassed by said reception frequency range.

3. A method as claimed in claim 1 wherein said frequency is a first frequency, and comprising radiating said electromagnetic signal with said first frequency and with a second frequency, with a difference between said first frequency and said second frequency being within said reception frequency range.

4. A method as claimed in claim 1 comprising radiating said electromagnetic signal with said frequency and with another frequency, said another frequency being within said reception frequency range.

5. A method as claimed in claim 1 wherein said electromagnetic signal is a first electromagnetic signal and said frequency is a first frequency, and wherein said method comprises:
  generating a second electromagnetic signal having a second frequency, with a difference between said first frequency and said second frequency being within said reception frequency range;
  applying said second electromagnetic signal to the patient so as to cause the second electromagnetic signal to interact with said at least a portion of said examination region, thereby causing said electromagnetic signal to undergo a modification so as to produce a modified second signal; and
  providing said modified second signal to said modulator and, in said modulator, generating said modulated signal based on the modified first signal and the modified second signal.

6. A method as claimed in claim 1 wherein said examination region exhibits a periodic movement comprising a first period and a second period, and wherein said electromagnetic signal is a first electromagnetic signal and wherein said frequency is a first frequency, said method comprising:
  applying said first electromagnetic signal having said first frequency at a first position relative to the patient, during said first period of said periodic movement;
  generating a second electromagnetic signal having a second frequency, and applying said second electromagnetic signal to the patient at a second position;
  generating a third electromagnetic signal having the first frequency, and applying said third electromagnetic signal to the patient at a third position; and
  generating a fourth electromagnetic signal having the second frequency, and applying the fourth electromagnetic signal to the patient at a fourth position.

7. A method as claimed in claim 1 wherein said modulator comprises a non-linear component, and generating said modulated signal in said modulator using said non-linear component.

8. A magnetic resonance (MR) apparatus comprising:
  an MR data acquisition scanner comprising a transmitting circuit, a control computer, a modulator, a reception circuit having a reception frequency range, and a determining processor;
  said control computer being configured to operate said MR data acquisition scanner, while a patient, comprising an examination region, is situated in the scanner in order to cause MR signals to be emitted by the examination region, and to receive said MR signals within the reception frequency range of said reception circuit;
  said control computer being configured to operate said transmitting circuit to emit an electromagnetic signal into the patient, said electromagnetic signal having a frequency that is outside of said reception frequency range, so as to cause said electromagnetic signal to interact with at least a part of the examination region of the patient, and thereby causing said electromagnetic signal to undergo a modification so as to produce a modified signal;
  the modified signal being received by said modulator, and said modulator being configured to generate a modulated signal from said modified signal, said modulated signal having a frequency that is within said reception frequency range;
  said modulator being configured to provide the modulated signal to the reception circuit; and
  said reception circuit being configured to forward the modulated signal from the reception circuit to said determination processor, and said computer being configured to determine movement information about said examination region based on said modulated signal, and to generate an electronic output signal in said determination processor that represents said movement information, and to make said electronic output signal available from said determination processor.

9. An MR apparatus as claimed in claim 8 wherein said control computer is configured to operate said transmitting circuit to radiate said electromagnetic signal with said frequency being higher than a maximum frequency encompassed by said reception frequency range.

10. An MR apparatus as claimed in claim 8 wherein said frequency is a first frequency, and wherein said control computer is configured to operate said transmitting circuit to radiate said electromagnetic signal with said first frequency and with a second frequency, with a difference between said first frequency and said second frequency being within said reception frequency range.

11. An MR apparatus as claimed in claim 8 wherein said control computer is configured to operate said transmitting circuit to radiate said electromagnetic signal with said frequency and with another frequency, said another frequency being within said reception frequency range.

12. An MR apparatus as claimed in claim 8 wherein said electromagnetic signal is a first electromagnetic signal and said frequency is a first frequency, and wherein said MR apparatus comprises:
  said control computer being configured to operate said transmitting circuit to generate a second electromagnetic signal having a second frequency, with a difference between said first frequency and said second frequency being within said reception frequency range;
  said control computer being configured to operate said transmitting circuit to apply said second electromagnetic signal to the patient so as to cause the second electromagnetic signal to interact with said at least a portion of said examination region, thereby causing said electromagnetic signal to undergo a modification so as to produce a modified second signal; and
  said modified second signal being provided to said modulator, and said modulator being configured to generate said modulated signal based on the modified first signal and the modified second signal.

13. An MR apparatus as claimed in claim 8 wherein said examination region exhibits a periodic movement comprising a first period and a second period, and wherein said electromagnetic signal is a first electromagnetic signal and wherein said frequency is a first frequency, and wherein said MR apparatus comprises:
  said control computer being configured to operate said transmitting circuit to apply said first electromagnetic signal having said first frequency at a first position relative to the patient, during said first period of said periodic movement;

said control computer being configured to operate said transmitting circuit to generate a second electromagnetic signal having a second frequency, and applying said second electromagnetic signal to the patient at a second position;

said control computer being configured to operate said transmitting circuit to generate a third electromagnetic signal having the first frequency, and applying said third electromagnetic signal to the patient at a third position; and said control computer being configured to operate said transmitting circuit to generate a fourth electromagnetic signal having the second frequency, and applying the fourth electromagnetic signal to the patient at a fourth position.

14. An MR apparatus as claimed in claim 8 wherein said modulator comprises a non-linear component, and is configured to generate said modulated signal in said modulator using said non-linear component.

15. An MR apparatus as claimed in claim 8 wherein said modulator comprises a passive component, and is configured to generate said modulated signal using said passive component.

16. An MR apparatus as claimed in claim 8 wherein said modulator is integrated in said reception circuit.

* * * * *